(12) United States Patent
Petralia et al.

(10) Patent No.: US 9,708,714 B2
(45) Date of Patent: Jul. 18, 2017

(54) PHOTOCHEMICAL PROCESS FOR DECORATING SURFACES WITH NANOPARTICLES

(71) Applicants: Salvatore Petralia, Paternó (IT); Giorgio Ventimiglia, Tremestieri Etneo (IT)

(72) Inventors: Salvatore Petralia, Paternó (IT); Giorgio Ventimiglia, Tremestieri Etneo (IT)

(*) Notice: Subject to any disclaimer, the term of this patent is extended or adjusted under 35 U.S.C. 154(b) by 0 days.

(21) Appl. No.: 14/478,784

(22) Filed: Sep. 5, 2014

(65) Prior Publication Data
US 2015/0072164 A1 Mar. 12, 2015

(30) Foreign Application Priority Data

Sep. 6, 2013 (IT) .............................. CT2013A0021

(51) Int. Cl.
*B05D 3/00* (2006.01)
*C08J 7/18* (2006.01)
(Continued)

(52) U.S. Cl.
CPC .............. *C23C 26/00* (2013.01); *B05D 3/002* (2013.01); *B05D 3/06* (2013.01); *C23C 18/14* (2013.01);
(Continued)

(58) Field of Classification Search
CPC . C23C 18/14; C23C 26/00; G03F 7/16; G03F 7/20; B82Y 40/00; B82Y 99/00
See application file for complete search history.

(56) References Cited

U.S. PATENT DOCUMENTS

2012/0141691 A1* 6/2012 Lin .................. C23C 18/08
427/558

OTHER PUBLICATIONS

Scir S et al: "Liquid phase photo-deposition in the presence of unmodified-cyclodextrin: A new approach for the preparation of supported Pd catalysts", Journal of Molecular Catalysis A: Chemical, Elsevier, Amsterdam, NL, vol. 353, Nov. 4, 2011 (Nov. 4, 2011), pp. 87-94, XP028357202, ISSN: 1381-1169, DOI: 10.1016/J. MOLCATA.2011.11.009 [retrieved on Nov. 15, 2011].
(Continued)

*Primary Examiner* — Michael Wieczorek
(74) *Attorney, Agent, or Firm* — Themis Law

(57) ABSTRACT

A photochemical process for decorating hydrophobic surfaces with nanoparticles includes the steps of providing a metal precursor having hydrophobic parts adapted to interact with assistance of a photosensitizer; and forming a reactive adduct photosensitizer/precursor-metal/surface, preparing the surface to grow metal nanoparticles in situ having sizes and shapes governed by the morphology of the surface. The formed nanoparticles are sufficiently isolated, not aggregated and not interconnected, and do not create a film but maintain the chemical properties of substrate and metal. Surfaces so selectively decorated have hydrophobic properties even with hydrophilic substrates. Substrates with multiple chemical functionalities are thereby obtained, which can selectively bind different molecules or biomolecules onto the substrate and the surface of the metal nanoparticles surface. A process according to the invention also allows decorating surfaces with two or more metallic species. Decorated substrates obtained with a process according to the invention are also disclosed.

11 Claims, 5 Drawing Sheets

(51) Int. Cl.
  *G21H 5/00* (2006.01)
  *C23C 26/00* (2006.01)
  *C23C 18/14* (2006.01)
  *B05D 3/06* (2006.01)
  *G03F 7/20* (2006.01)

(52) U.S. Cl.
  CPC ......... *G03F 7/20* (2013.01); *Y10T 428/12063* (2015.01)

(56) References Cited

OTHER PUBLICATIONS

Salvatore Giuffrida et al: "Photochemical Mechanism of the Formation of Nanometer-Sized Copper by UV Irradiation of Ethanol Bis(2,4-pentandionato)copper(II) Solutions", Chemistry of Materials, vol. 16, No. 7, Apr. 2004 (Apr. 2004), pp. 1260-1266, XP055000430, ISSN: 0897-4756, DOI: 10.1021/cm034782h.

Guglielmo G Condorelli et al: "A single photochemical route for the formation of both copper nanoparticles and patterned nanostructured films", Journal of Materials Chemistry, Royal Society of Chemistry, GB, vol. 13, Sep. 4, 2003 (Sep. 4, 2003), pp. 2409-2411, XP002543444, ISSN: 0959-9428, DOI: 10.1039/B308418C [retrieved on Sep. 4, 2003].

Luo N et al: "Directly ultraviolet photochemical deposition of silver nanoparticles on silica spheres: Preparation and characterization", Materials Letters, North Holland Publishing Company, Amsterdam, NL, vol, 63, No. 1, Jan. 15, 2009 (Jan. 15, 2009), pp. 154-156, XP025587235, ISSN: 0167-577X, DOI: 10.1016/J.MATLET.2008. 09.033 [retrieved on Sep. 27, 2008].

Isaeva (Volkova) E I et al: "Photochemical Synthesis of Silver Nanoparticles on the Surface of Polystyrene Globules", Russian Journal of General Chemistry, Nauka/Interperiodica, MO, vol. 75, No. 9, Sep. 2005 (Sep. 2005), pp. 1340-1345, XP019301211, ISSN: 1608-3350.

T. B. Boitsova et al: "Photochemical deposition of colloidal Au—Ag particles on quartz", Inorganic Materials vol. 36, No. 6, Jun. 2000 (Jun. 2000), pp. 565-567, XP055117237, ISSN: 0020-1685, DOI: 10.1007/BF02757954.

\* cited by examiner

PHOTOCHEMICAL PROCESS FOR DECORATING SURFACES WITH NANOPARTICLES

FIELD OF THE INVENTION

The present invention finds application in the field of materials science, biomedicine, molecular diagnostics, industrial catalysis, environmental chemistry and engineering, textile, optics, chemical and biochemical sensing. More particularly, the present invention relates to a photochemical process for the decoration of surfaces with metallic and inorganic nanoparticles.

The present invention also relates to photo-decorated substrates obtained by means of the above process.

BACKGROUND OF THE INVENTION

Materials having surfaces decorated with metal nanoparticles are substrates common in many industrial applications. The areas of applications are strictly dependent on the nature of both the nanoparticles and the surface of the substrate.

Substrates consisting of polystyrene microspheres decorated on the surface with metal nanoparticles have been widely studied in the literature.

M. Bradley reports the use of such materials as catalysts for intracellular enzymatic reaction (R. Yusop, A. U. Broceta, E. M. V. Johansson R M Sanchez-Martin and M. Bradley palladium-mediated intracellular nature chemistry vol 3 (2011) 239-243).

These polymeric microspheres are widely used in the biomedical field. Saralidze et al. show the relationship between the various methods of synthesis of the microspheres and application areas. (K. Saralidze, L H Koole and M L W Knetsch. Polymeric Microspheres for Medical Applications Materials, 3 (2010) 3537-3564).

L. Xianqiao in his paper reports the application of polymeric microspheres decorated with magnetic nanoparticles for applications in the field of purification of antibodies (Xianqiao L., G. Yueping, Yueping Y., Yu, M. Zhiya, W. Xiaobing, L. Huizhou. Preparation of superparamagnetic immunomicrosphere and application for antibody purification J. Appl. Polym. Sci. 94 (2004) 2205-2211).

Substrates made of semiconductor materials decorated on the surface with metal nanoparticles have been found of great interest for applications in the environmental field thanks to their technological properties. In this regard, S. Kochuveedu shows the photocatalytic activity of $TiO_2$ nanospheres decorated with Au nanoparticles for the oxidation of volatile organic compounds (Saji Thomas Kochuveedu, Dong-Pyo Kim, and Dong Ha Kim, Surface-Plasmon-Induced Visible Light photocatalytic Activity of $TiO_2$ Nanospheres Decorated by Au Nanoparticles with Controlled Configuration. J. Phys. Chem. C 2012, 116, 2500-2506).

In order to obtain antibacterial and bacteriostatic fibers or textiles for various commercial products such as plasters, bandages, coats, pillows, socks, underwear etc., fibers are chemical treated to allow the deposition of metal nanoparticles on the fiber or the fabric textiles surface.

For this purpose, silver is the most used metal for this kind of applications. B. Filipowska in his work describes the manufacturing of cotton fibers decorated with metal nanoparticles of silver and demonstrates their particular antibacterial and antifungal properties (Filipowska B. et al, New Method for the antibacterial and antifungal modification of silver finished textiles & fibers textiles in eastern Europe 2011, Vol 19 4 (87) 124-128).

Several substrates properly surface-decorated with metal nanoparticles have important optical properties and find wide applications in the sensing area.

For example, carbon nanotubes surface-decorated with metal nanoparticles are widely used in the field of optical devices, sensors and as photovoltaic materials.

Prakash in his publication demonstrates how the introduction of metal nanoparticles in the heterogeneous organic/inorganic junction of solar cells, consisting of carbon nanotubes, increases the yield of the photovoltaic system (Prakash R. Somani, Savita P. Somani, and M. Umeno Application of metal nanoparticles decorated carbon nanotubes in photovoltaics Applied Physics Letters Vol. 93 (3) 2008).

Frank, in a 2004 work, shows the preparation of silica microspheres decorated with gold nanoparticles for an application in the field of chemical sensing (O. Frank, H. Hiroki, P. Rhiannon, G. Ting, Alkanethiol-induced structural rearrangements in silica-gold core-shell-type nanoparticle clusters: an opportunity for chemical sensor engineering, Langmuir 20 (2004) 5553-5558).

The preparation of substrates, surface-decorated with metal nanoparticles, can be carried out with a top-down or bottom-up approach.

In the "top-down" approach, nano-dimensional materials like nanoparticles can be produced by physical methods such as photolithography, electron beam lithography, milling or attrition from macroscopic materials (Gao, G., Nanostructures and nanomaterials. Synthesis, Properties & Applications. London: Imperial College Press, 2004).

In the "bottom-up" approach, nanoparticles are produced from molecular precursors by means of chemical processes. The typical techniques of this approach are nanosphere lithography, templating, chemical reduction, electrochemical reactions and sonochemical reactions.

In the bottom-up approach, nanoparticles originate from chemical precursors by means of processes of nucleation and growth of the crystal lattice (Tolaymat, T., El Badawy, A., Genaidy, A., Scheckel, K., Luxton, T., Suidan, M., An evidence-based environmental perspective of manufactured silver nanoparticle in syntheses and applications: a systematic review and critical appraisal of peer-reviewed scientific papers Sci. Tot. Environ., (408) 5, (2010) 999-1006).

It has been shown that the use of protective agents (capping agents) in the preparation of nanoparticles in the bottom-up method is often necessary for tuning the size, shape and stability of nanoparticles, but the result is the coating of a metal surface, changing the reactivity and the physical-chemical properties of nanoparticles (S. Scire', S. Giuffrida, C. Crisafulli, P M Riccobene, A. Pistone, Journal of Molecular Catalysis A: Chemical, 353-354 (2012) 87-94 and Balan, L., Malval, J., Schneider, R., Burget, D., Mater. Chem. Phys, 104 (2007) 417-21).

The conventional methods for the preparation of surfaces decorated with metallic nanoparticles are based on a bottom-up approach and consist in the pre-formation of metal nanoparticles, through thermal or photochemical chemical reduction, and the subsequent process of interaction adhesion with the surface of the substrate.

The following references report the state of the art of conventional methods for the preparation of decorated surfaces with metallic nanoparticles.

U.S. Pat. No. 7,666,494 B2 (D J McClure and M A Perez) reports a vapor phase method for the preparation of a monolayer of metal nanoparticles.

Filipowska B. et al, New Method for the antibacterial and antifungal modification of silver finished textiles fibers & textiles in eastern Europe, Vol 19 4-87 (2011) 124-128, describes the manufacturing of textile fibers decorated with silver nanoparticles.

US 2011/0110999 A1 describes a method for the deposition of preformed silver nanoparticles on the surface of natural and synthetic textile fibers.

U.S. Pat. No. 4,772,150 B2 describes a method for the preparation of porous surfaces decorated with metal nanoparticles; this method provides for the direct contact between a suspension of preformed nanoparticles with the porous surface of the substrate, and in such conditions the nanoparticles, only if of a suitable size, diffuse into the pores of the surface interacting with it.

K. T. Yong et al, Synthesis and plasmonic properties of silver and gold nanoshells on polystyrene cores of different size and gold-silver core-shell nanostructures Colloids and Surface; A 290 (2006) 89-105, describe a method for the preparation of nanoshell of gold and silver on the surfaces of polystyrene microspheres.

S T Kochuveedu et al, Surface-Plasmon induces visible light photocatalytic activity of TiO2 nanospheres decorated by Au nanoparticles with controlled configuration; J. Phys. Chem C 116, (2012) 2500-2506, describe a process for the decoration with gold nanoparticles of the surfaces of nano core-shell structures based on silicon oxide and titanium oxide.

However, conventional methods, based on the direct interaction of preformed nanoparticles prepared by chemical reduction with substrate surfaces, have shown several drawbacks such as the introduction of an additional chemical reducing agent and its subsequent removal step.

With this method, in order to allow a good interaction between the surface and the nanoparticles, it is crucial that the pre-formed metal nanoparticles have well-defined dimensions, namely less than the average size of the pores of the surface.

Conventional methods based on photochemical reactions for the preparation of metal nanodecorated surfaces are described in the following references:

U.S. Pat. No. 7,749,300 B2 (Chreien) describes a photochemical method for the production of core-shell bimetallic systems consisting of a metallic core of a first metal and a shell of a second metal. This method involves the mixing of the metal salts and chemical reducing agent;

U.S. Pat. No. 308,842 A1 describes a photochemical method for the preparation of nanodecorated surfaces; it is based on a photochemical modification of a polymeric monolayer previously deposited on the surface, containing a core-shell metal. This method involves several steps: deposition on the surface of a single layer of polymer containing the metal precursor, irradiation of the polymeric layer, removal of the polymeric layer by means of chemical agents;

Scirè S. et al (Supported silver catalysts prepared by deposition in aqueous solution of Ag nanoparticles Obtained through to photochemical approach; Applied Catalysis A 367 (2009) 138-145), describe a photochemical method for the preparation of substrates of Titania and Ceria with their surface decorated with silver nanoparticles, through the interaction of the substrate with photochemical pre-formed nanoparticles.

Photochemical methods for the direct decoration of surfaces are reported in the literature. For example, L. Costanzo in 2003 and S. Giuffrida in 2004 reported a direct photochemical method for the deposition of metal on hydrophilic substrates, such as quartz and silicon oxide, through the formation of nanostructured interconnected films. This method provides for the preparation of surfaces completely covered with homogeneous metallic films. No interaction between metal precursor and surface was reported, and that method does not allow the preparation of isolated, not interconnected and well anchored nanoparticles (G G Condorelli, L L Costanzo, I L Fragalá, S. Giuffrida and G. Ventimiglia, J. of Mater. Chem. 13 (2003) 2409-2411; S. Giuffrida, G G Condorelli, L L Costanzo, I L Fragalá, G. and G. Ventimiglia Old Chem. Mater. 16 (2004) 1260-1266).

In 2009, N. Luo et al reported a photochemical method for the deposition of metal nanoparticles on hydrophilic substrates ($SiO_2$ microspheres) starting from polar precursors (ammonium salts). This method shows the formation of silver nanoparticles in the surface proximity and their subsequent deposition without direct interaction between metal precursor and surface (N. Luo, L. Mao, L. Jiang, Z. Wu, D. Wu, Material Letters 63 (2009) 154-156).

At present, no method is reported in literature that allows a selective decoration of a substrate according to its hydrophilic and hydrophobic properties.

SUMMARY OF THE INVENTION

An object of the present invention is to produce decorated surfaces at the nanometer level with metal or inorganic nanoparticles that re sufficiently isolated, not interconnected and with different shapes and sizes.

The term "decorated surfaces at the nanometer level," as used in the present invention, is related to a material produced by a process that involves the initial formation of the reactive adduct "photosensitizer/metal-precursor/surface" formed by the interaction between the metal precursor, having hydrophobic parts, and the hydrophobic surface of the substrate to decorate and with the assistance of a suitable photosensitizer.

This process may be performed in the presence of inert or reactive gas. This process allows the preparation of surfaces decorated with metallic nanoparticles grown in situ, of a size and shape that are rationally tuned by the morphology of the substrate surface, whereas the nanoparticles are sufficiently isolated, not aggregated and not interconnected so not to form films. For this reason, the invention allows retaining the chemical properties of both the substrate (the undecorated surface part) and the metal.

Therefore, this process allows obtaining substrates with multiple chemical functionalities, able to selectively bind different molecules or biomolecules on the substrate surface and on the metal nanoparticle surface, exploiting the different chemical reactivities of the different materials. In FIG. 1 an example of bi-functionality is reported, where a substrate with epoxy-functionalized hydrophobic surface (water contact angle about 70°) is decorated with silver nanoparticles, obtaining a bi-functional substrate, having the metal nanoparticles surface able to bind just molecules properly that are modified with a thiol group, and the epoxy groups suitable to link other molecules that are amino modified.

This process in composed by an initial surface activation step by means of an ultrasonic treatment with organic solvents that allows the removal of organic residues from the surface and the formation of the reactive adduct with the metal precursor. The reactive adduct "photosensitizer/metallic precursor/surface" is subsequently subjected to irradiation with an appropriate monochromatic wavelength for a time less or equal to 1200 seconds, with immediate formation of a metallic nanoparticle on the substrate surface.

The by-products of the reaction, having a hydrophobic nature, can be easily removed by evaporation. The decorated substrate is then washed with suitable solvents.

By means of this process, pure naked metal nanoparticles can be prepared that are free of additives and capping agents, because no reducing agents are used for metal formation and the by-products are easily and quantitatively removed by a vacuum process under mild conditions. The disappearing of the main by-products can be easily spectrophotometrically monitored, while the absence of molecules surrounding the metal surface can be excluded by a Z-scan technique (S. Giuffrida, G. Ventimiglia, S. Sortino, Straightforward green synthesis of "naked" aqueous silver nanoparticles, Chem. Commun., 2009, 4055-4057).

These objects, and others which will appear clearer hereinafter, are achieved by a process in accordance with the invention, which includes an activation step of the substrate, a reactive adduct formation, an irradiation of the surface, and the removal of by-products.

amount of additives, in order to increase the solubility of the metal precursor, venting with inert gas (Ar, $N_2$, or similar) or reactive gas ($O_2$, $H_2$ or similar), if necessary.

The present invention allows the preparation of surfaces decorated with nanoparticles of two or more types of metals, using a single solution containing the different metal precursors, provided that it is soluble in the same solvent, using two or more light radiations.

The metallic precursor may have a molecular structure characterized by a hydrophobic site involved in the interaction with the hydrophobic surface. These precursors are selected among the following classes: Me-Lx, where L could be different ligands which include, without limitation, the following types: beta-diketone anion (R—CO—CH=CO—R'), cyclopentadienyl anion and any organic compound, while x is the number of different ligands.

The beta-diketones are selected from the classes reported in table 1:

TABLE 1

List of main beta-diketones.

| Abbreviation | Name | Synonym |
|---|---|---|
| Hacac | acetylacetone | 2,4-pentanedione |
| Hacac-$F_7$ | perfluoroacetylacetone | heptafluoroacetylacetone 1,1,1,3,5,5,5-heptafluoro-2,4-pentanedione |
| Hbfa | Benzoyl-2-furanoylmethane | |
| Hbpp | 1,3-bis(3-pyridyl)-1,3-propanedione | |
| Hbtfac | benzoyltrifluoroacetone | |
| Hbzac | benzoylacetone | 1-phenyl-1,3-butanedione |
| Hdbbm | Di(4-bromo)benzoylmethane | |
| Hdcm | d,d-dicampholylmethane | |
| Hdmbm | 4,4'-dimethoxydibenzoylmethane | |
| Hdmh | 2,6-dimethyl-3,5-heptanedione | |
| Hdnm | dinaphtoylmethane | |
| Hdpm | dipivaloylmethane | 2,2,6,6-tetramethyl-3,5-heptanedione |
| Hdppm | Di(perfluoro-2-propoxypropionyl)methane | |
| Hdtp | 1,3-di(2-thienyl)-1,3-propanedione | |
| Hfacam | 3-(trifluoroacetyl)-d-camphor | |
| Hfdh | 6,6,6-trufluoro-2,2-dimethyl-3,5-hexanedione | Pivaloyltrifluoroacetone 5,5-dimethyl-1,1,1-trifluoro2,4-hexanedione |
| Hfhd | 1,1,1,2,2,6,6,7,7,7-decafluoro-3,5-heptanedione | |
| Hfod | 6,6,7,7,8,8,8-heptafluoro-2,2-dimethyl-3,5-octanedione | |
| Hftac | 2-furyltrifluoroacetone | 4,4,4-trifluoro-1-(2-furyl-1,3-butanedione |
| Hhfac | hexafluoroacetylacetone | 1,1,1,5,5,5-hexafluoro-2,4-pentanedione |
| Hhfbc | 3-(heptafluorobutyryl)-d-camphor | |
| Hhfth | 4,4,5,5,6,6,6-heptafluoro-1-(2-thienyl)-1,3-hexanedione | |
| Hmfa | 4-methylbenzoyl-2-furanoylmethane | |
| Hmhd | 6-methyl-2,4-heptanedione | |
| Hntac | 2-naphthoyltrifluoroacetone | 4,4,4-trifluoro-1-(2-naphtyl)-1,3-butanedione |
| Hpop | 3-(5-phenyl-1,3,4-oxadiazol-2-yl)-2,4-pentanedione | |
| Hppa | 3-phenyl-2,4-pentanedione | |
| Hpta (=Htpm) | pivaloyltrifluoroacetone | 5,5-dimethyl-1,1,1-trifluoro-2,4-hexanedione |
| Hptp | 1-phenyl-3-(2-thgienyl)-1,3-propanedione | |
| H(l-cam) | 3-(tert-butylhydroxymethylene)-d-camphor | |
| Htfac | trifluoroacetylacetone | 1,1,1-trifluoro-2,4-pentanedione |
| Htfn | 1,1,1,2,2,3,3,7,7,8,8,9,9,9-tetradecafluoro-4,6-nonanedione | |
| Hthd (=Hdpm, Htmhd) | 2,2,6,6-tetramethyl-3,5-heptanedione | dipivaloylmethane |
| Htnb | 4,4,4-trifluoro-1-(2-naphtyl)-1,3-butanedione | |
| Htmod | 2,2,6,6-tetramethyl-3,5-octanedione | |
| Htrmh | 2,2,6-trimethyl-3,5-heptanedione | |
| Htod | 2,2,7-trimethyl-3,5-octanedione | |
| Htta | 2-thenoyltrifluoroacetone | 4,4,4-trifluoro-1-(2-thienyl-1,3-butanedione |

In a particular form of execution of the process, exemplifying and not limiting the invention, the decorated surfaces, at the nanometer level, can be produced via a photochemical process that includes the addition of a certain The ligands L, as well as the groups R and R', can be selected from the following classes of organic compounds derivates: alkyl, aliphatic, acenes, alicyclic, annulenes, annulenylidenes, ansa compounds, antiaromatic compounds, arene and its derivates, aromatic compounds (included mono e polycicles), aryl cations, aryl groups, arylene groups, arynes, benzenium ions, benzenium ions, benzylic groups, benzynes, calixarenes, carbocyclic compounds, catenanes/catena compounds, cavitands, crown compounds, coumarins, cryptands/cryptates, cycloalkanes, cycloalkyl groups, cyclohexadienyl cations, cyclophanes, dehydroarenes, dehydrobenzenes, fenestranes, fullerenes, fulvalenes, fulvenes, helicenes, hetarenes, hetaryl groups, hetarynes, heteroarenes, heterocyclyl groups, heteroarynes, homocyclic compounds, isocoumarins, mancude-ring systems, molozonides, naphthenes, ozonides, paddlanes, polyhedranes, polyquinanes/polyquinenes, propellanes, quinarenes, rotaxanes, spiro compounds.

The interactions between the hydrophobic site of the metal precursor with the hydrophobic surface is driven by the polar environment, having water or alchol as media reaction. In this scenario, the hydrophobic surface will be enriched in metal precursor, as well as having a hydrophobic photosensitizer, facilitating adduct formation. In a recent paper (G. Ventimiglia, A. Motta, Sensors & Transducer Journal 146 (2012) 59-68), this interaction was widely demonstrated by means of a DFT modeling. In particular, in a polar medium as water, selective interactions were reported between the hydrophobic site of the metal precursor with the hydrophobic cyclodextrin cavity.

In literature it is widely reported that beta-diketonate metal precursors show a weak interaction with the OH groups of the hydrophilic substrate, such as silica, alumina, glass, quartz, ITO, causing the decomposition of metal precursor, being the ligand remained absorbed on surface (M. Lashdaf et al, Applied Catalysis A: General 241 (2003) 51-63; J. P. Boitiaux, J. Cosyns, S. Vasudevan, Stud. Surf. Sci. Catal. 16 (1983) 123, E. Lesage-Rosenberg, G. Valic, H. Dexpert, P. Lagarde, E. Freund, Appl. Catal. 22 (1986) 211), with the consequent decreasing of the metal precursor available for the reduction. To further support the hypothesis of the weak interaction and the degradation of the beta-diketonates metal precursor with hydrophilic surfaces, such as silica, our experiments with Pt(acac)$_2$ confirm that the photodecoration on silica beads is not effective if compared with the hydrophobic surface such polystyrene beads.

Thanks to these features, the present invention allows a selectively decoration of hydrophobic surfaces also in the presence of hydrophilic surfaces, as shown in FIG. 2 (see also Example 2). With the present method, a variety of metals or semimetals, including but not limited to platinum, palladium, silver, gold, copper, cobalt, nickel, iron, manganese, rhodium, rhenium, ruthenium, iridium, osmium, silicon and other elements can be used.

The nanoparticles formed by this photochemical method have a size less than 80 nm (including a dimensions under 1 nm). The substrate to be decorated may have different shapes such as particles, spheres, films, sheets, blocks, fibers, membranes, reactors with different dimensions, wellplates with different volumes and shapes, tubes and microtubes with different shapes and sizes, and the substrate may have other shapes and sizes that are not included in this list for the sake of brevity.

The surface of the substrate can be flat, irregular, smooth, rough and/or porous (with different pore sizes).

The nature of the substrate to be decorated must be hydrophobic (water contact angle>55°) so to ensure the interaction with the metal precursor and with the photosensitizer, both containing hydrophobic parts. The nature of the substrate could be: metal, alloy-metal, polymer resin, plastic, rubber, natural material for textile (cotton, linen, wool, silk and similar), synthetic material for textile applications (all synthetic polymers such as nylon, polyamide, polyester and similar), artificial material for textile applications (flax for linen and similar), oxides of cerium, oxides of titanium, aerogel or xerogel, silica, silicon derivatives such as silicon carbide, silicon nitride and other materials that are not included in this list for the sake of brevity.

The substrate can have the properties of an electrical conductor, semiconductor, insulator, and can have optical properties such as transparency and opacity, with no limit placed on the nature of the substrate that can be used.

The solution of the metal precursor can be vented by inert or reactive gas. A certain amount of photosensitizer agent must be added to the reaction medium in order to sensitize the in situ formation of metallic nanoparticles by varying reaction rate.

The photosensitizer is an organic molecule having a hydrophobic molecular structure capable to interact with the metal precursor and with the surface.

By this method a great variety of photosensitizing agents may be used such as: aliphatic and aromatic ketones (acetone, acetophenone, benzophenone, and ketones polymer, like polyvinylpyrrolidone and others), aromatic compounds such as benzene, toluene, methyl-benzoate, benzaldehyde xanthine triphenylamine, alcohols (ethyl alcohol, methyl and propyl), polycyclic aromatic hydrocarbons, conjugated compounds and poly-conjugates, organometallic compounds, aniline-based compounds, terephthalic acid based compound rose bengal, riboflavin, porphyrins and related macrocyclic compounds tetrapyrroles (Etioporfirina, Cuproporfirina II, III uroporphyrin, protoporphyrin, ematoprfirina and its derivatives, deuteroporfirina, mesoporphyrin, Rodoprofirina and similar).

The mechanism of photosensitization of the metal precursor can occur through two alternative mechanisms: (i) a process of electron transfer from a donor molecule (D or sensitizer) to the acceptor molecule (A or the metal precursor) with a reaction that can be schematized as follows: D*+A→D$^+$+A$^-$, or (ii) through a mechanism of energy transfer between donor and acceptor according to the following scheme: D*+A→D+A*. In both cases, the metal precursor reaches an excited state, from which the process of photochemical reduction of the metal proceeds.

A third mechanism improperly defined sensitized, concerns the reduction of the metal precursor through interaction with ketyl radicals RC.O acting as electron sources. These radicals are formed through a process of photochemical cleavage (Norrish Type I) due to excitation of ketyl sensitizers agents, as follows:

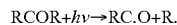

$$RCOR+h\nu \rightarrow RC.O+R.$$

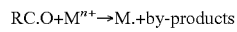

$$RC.O+M^{n+} \rightarrow M.+by\text{-}products$$

The main advantages of this invention compared to conventional thermal and photochemical methods for decoration at the nanometer level are the possibility of nucleation and growth of nanoparticles directly on the substrate surface, thanks to the fact that the photochemical reaction of decoration takes place on the substrate surface due to the adduct "photosensitizer/precursor-metal/surface" presence.

An advantage of this invention is the opportunity to prepare decorations for flat surfaces with single nanoparticles, isolated and not interconnected, while the photochemical methods reported in the literature are aimed to producing nanostructured metal films or nanoparticle aggregates.

Regarding the microspheres, an advantage of this invention is that it allows obtaining the decoration, at nanometer level, of porous surfaces regardless of the size of their pores. While with conventional methods, in fact, there is a limitation in the use of pre-formed metal nanoparticles having necessarily smaller average size of the pores of the surface, with the present invention it is possible to decorate the pores of any size and it is also possible to decorate simultaneously porous surfaces with pores of different sizes, in the same reaction medium.

Another advantage of this invention is the absolute absence of typical chemical reducing agents. In this process, the light is, in fact, the agent that promotes the photoreduction. The working wavelength depends on the nature of the metal precursor or of the sensitizer. It is possible to perform the photo-direct decoration irradiating the solution at a wavelength of absorption of the metal precursor, for example 254 nm, or a sensitized photodecoration by irradiating at a wavelength of absorption of the sensitizer (i.e. 300 nm in the case where acetone is used as a sensitizer).

A further advantage of this invention is the possibility of preparing surfaces decorated with nanoparticles of two or more metals by irradiating selectively each metal precursor with the appropriate wavelength, suitable to promote photochemical activation. Under these conditions it is possible to properly modulate the quantity and size of the different types of metal nanoparticles, obtaining surfaces with a fine tuned content of the various metallic species.

The use of light as a reagent in this invention presents considerable advantages, including not producing by-products and being able to be easily added and removed from the reaction medium.

A very important advantage of this invention is the ability to perform site-specific decorations, i.e. by directing the beam on a given region of the substrate surface. For example, using a photomask, the substrate surface will be appropriately decorated according to specific models and diagrams.

These features enable a significant reduction in costs, preparation time, and enable as well the decoration on certain areas of the surface to obtain patterned structures. Indeed, this invention allows the preparation of electric nano and micro-contacts of different sizes and shapes on the surface of the processed substrates. These electric contacts were prepared using the diagram shown in FIG. 3.

In FIG. 3, an appropriate photo-mask was placed over the surface of the substrate, creating empty pathways over the surface that are then filled with the metal precursor solution. The irradiation, by means of light of a reactive wavelength, was carried out from the top, in an inert atmosphere. After the irradiation, the photomask was removed and the surface subjected to washing and drying in order to remove the reaction medium from the surface.

This method has the advantage of preparing the electric contacts of modular shape and size by means of a versatile and modular photomask, using a small amount of metallic precursor.

An advantage of this invention is the possibility to modulate the preparation time, the size and shape of the nanoparticles by appropriately varying the amount of sensitizer (not more than 10%) and of metal precursor (not more than 0.01M). The time of irradiation, depending on the metal precursor amount and depending on the amount of sensitizer agent, is equal to or below 1200 second.

A thermal process can improve the stability of the metal decoration: heating the nanodecorated surface at a suitable temperature below the degradation temperature of the substrate, the interaction between the substrate surface and the metal nanoparticles may increase, allowing the diffusion of metal nanoparticles into the substrate.

Advantageous embodiments of the invention are also described.

BRIEF DESCRIPTION OF THE DRAWINGS

Additional characteristics and advantages of a process according to the invention will become more evident in view of the detailed description of some preferred but not exclusive embodiments, illustrated by way of examples for purely illustrative and not limiting purposes with the aid of the accompanying drawing, in which.

DETAILED DESCRIPTION OF EMBODIMENST OF THE INVENTION

The examples reported below are purely illustrative and do not limit the present invention in any manner.

Example 1

Figure 1:
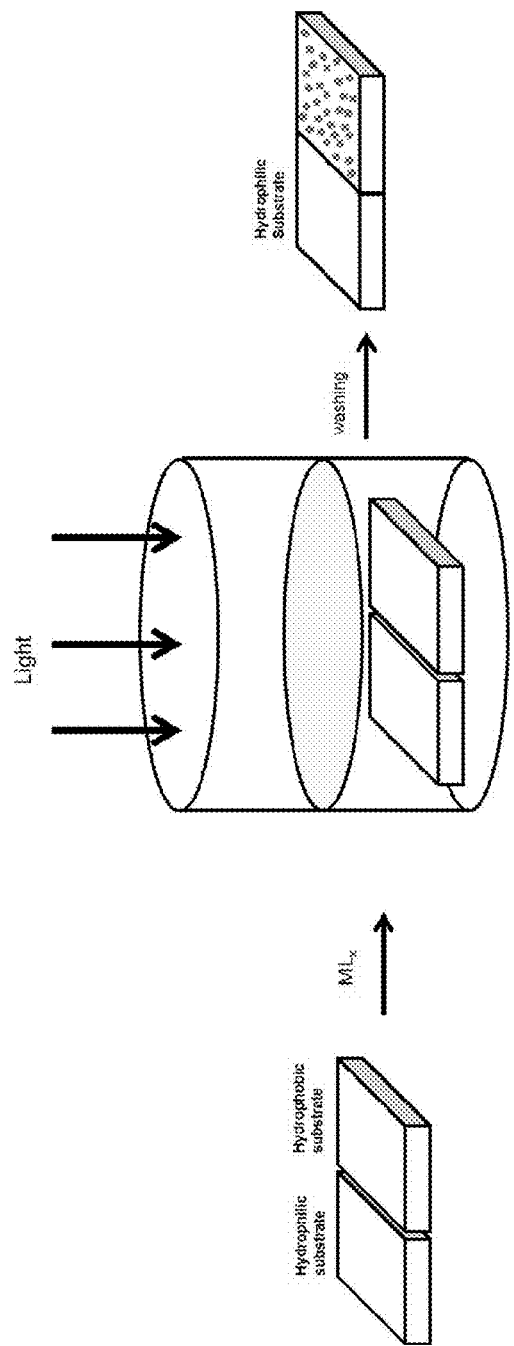
FIG. 1 shows the outline of a process of bi-functionalization of surfaces decorated with metal nanoparticles by means of the present invention.
Figure 2:
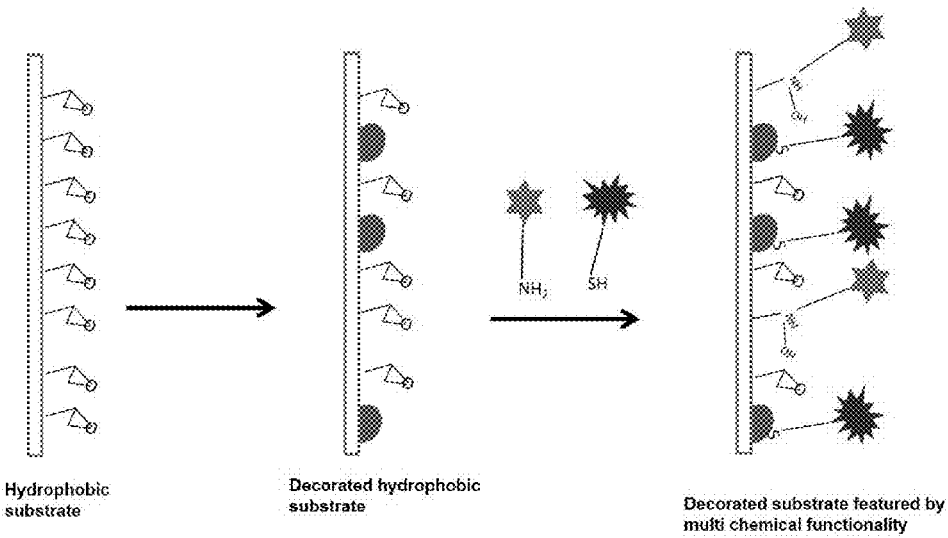
FIG. 2 illustrates a process of selective decoration of a hydrophobic surface in the presence of a hydrophilic surface.
Figure 3:
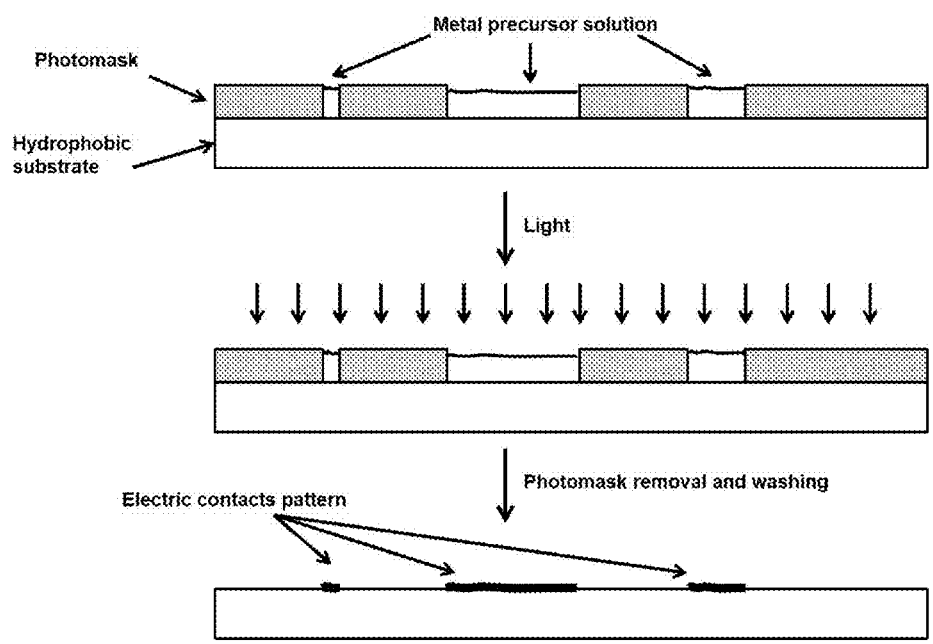
FIG. 3 illustrates the process of decoration to form patterned structures (with light radiation from the top)
Figure 4:
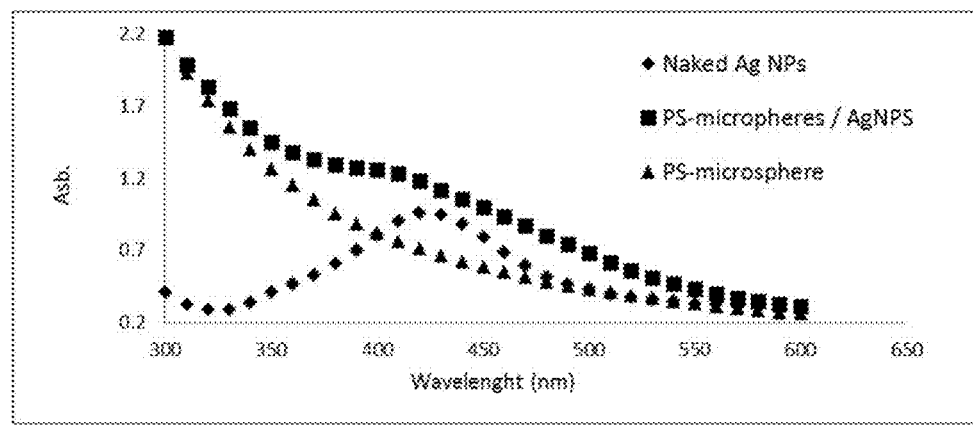
FIG. 4 shows the absorption spectrum of UV-Vis: (◇) a solution containing silver nanoparticles, (■) polystyrene microspheres photodecorated with silver nanoparticles, and (▲) polystyrene microspheres.
Figure 5:
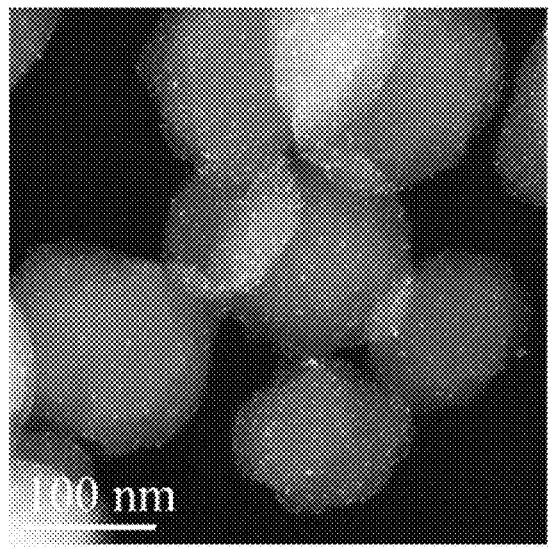
FIG. 5 shows a TEM image of polystyrene microspheres decorated with silver nanoparticles (Ag)
Figure 6:
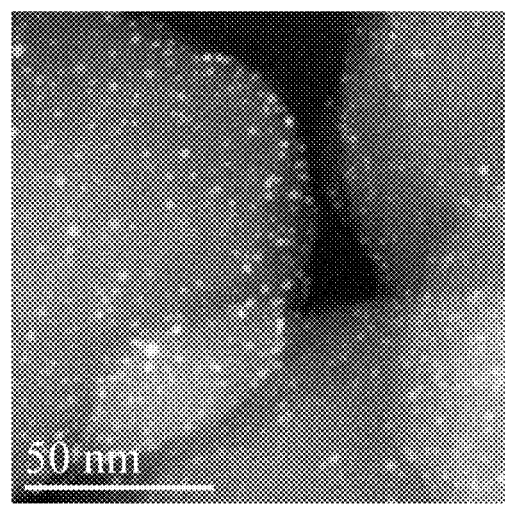
FIG. 6 shows a TEM image of polystyrene microspheres decorated with palladium nanoparticles (Pd)

A volume of 1 ml of Polystyrene (PS) porous beads suspension (concentration beads 40 mg/ml—beads size 200 nm) was dispersed in 19 ml of Ag(acac) de-aerated water solution (4.5 mg/100 mL), a certain amount (1%) of acetone was added to the reaction media as sensitizer. After degassing with Ar flow, the so prepared solution was irradiated in an appropriate photoreactor with UV light (254 nm) for 5 minutes. The orange-yellow suspension of PS-beads photodecorated with silver nanoparticles was centrifuged at 13500 rpm for 5 min, and the colored precipitate was washed several times with water. A solid precipitate of Ag-naked nanoparticles was obtained on the bottom of the tube. Naked silver nanoparticles were precipitated down the tube and separated. The orange precipitate was analyzed by UV spectrophotometric method and by TEM. UV-spectra reported in FIG. 4 shows the typically silver metal plasmon band absorption centered at 430 nm for Ag-naked nanoparticles, and for comparison the UV spectra of beads-naked and PS-beads photodecorated with silver nanoparticles. The silver on beads was demonstrated by the absorption band at about 400 nm on a suspension of PS-bead photodecorated with Ag NPs. The direct comparison between the different spectra clearly indicates the successful photodecoration of polystyrene microspheres with nanoparticles of silver. FIG. 5 reports a TEM micrograph of PS-beads decorated with Ag NPs where silver nanoparticles are clearly visible.

Example 2

Selective decoration of a hydrophobic surface of polystyrene in presence of a hydrophilic glass surface with silver nanoparticles.

A slide of hydrophobic polystyrene (about 70° water contact angle value) and a hydrophilic glass slide (about 10° water contact angle value) were previously activated with ethanol in ultrasound for 5 minutes and then immersed in 20 mL of ethanol solution containing Ag(acac) in a concentration of 2.2 mg/20 ml, in the presence of 1% of acetone as sensitizer. After 20 minutes of stirring by argon flow both substrates were irradiated with UV lamps at 254 nm for 5 minutes. After irradiation the substrates were washed with deionized water and dried with nitrogen flow. The hydrophobic polystyrene substrate resulted decorated with the typical yellow color of the silver plasmon band, while the hydrophilic glass substrate was completely colorless and transparent without any metallic decoration on the surface.

Example 3

Figure 7:
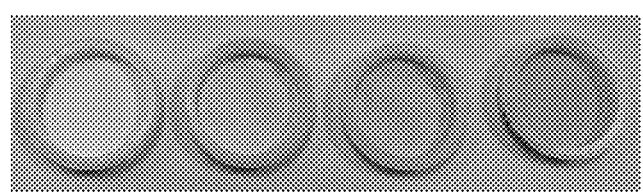
FIG. 7 shows a photograph of a nylon membrane 6-6 phototodecorated with nanoparticles of silver (Ag) at different irradiation times: 0, 2, 4 and 8 minutes.

A membrane of nylon 6,6 with a diameter of 3 cm was immersed in 20 mL of water containing Ag(acac) in a concentration of 2.2 mg/20 ml, in the presence of 1% of acetone. After 20 minutes of degassing the media reaction with argon flow, the membrane was irradiated in a photoreactor equipped with appropriate UV lamps at 254 nm for several minutes (2, 4, and 8 minutes). After irradiation, the membrane was washed with deionized water and dried with nitrogen flow. The membrane was typically silver stained. FIG. 7 shows the images related to the decorated membrane prepared at different times of irradiation.

Example 4

Figure 8:
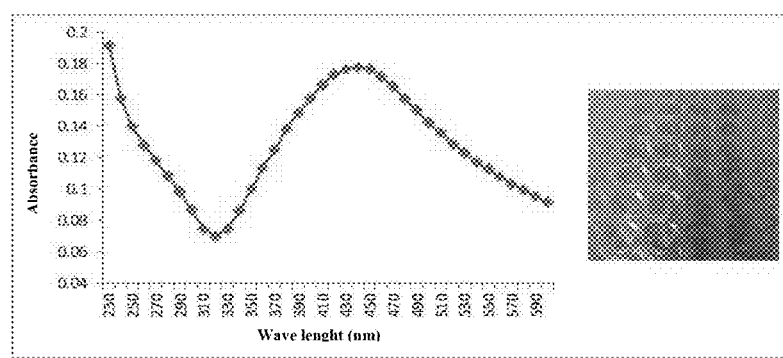
FIG. 8 shows the absorption spectrum of the UV-Vis of a well plate, photodecorated with nanoparticles of silver (Ag), and a picture of the 96-well plate with 4 columns photodecorated with nanoparticles of silver (Ag).

The wells of a Corning 96-well plate, featured by a bottom that is flat and transparent to UV radiation, were filled with 200 uL of an aqueous solution of Ag(acac), having a concentration of 0.60 mg/ml and containing 1% acetone. This plate (UV transparent) was irradiated from the bottom using a special photoreactor equipped with UV lamps from 254 nm for 8 min. The loading and irradiation steps were performed in a glove-box under an inert atmosphere of Argon. After irradiation the plate was washed several times with deionized water and dried with nitrogen flow. The wells of the plate containing the silver precursor and irradiated presented a silvered yellow surface. The presence of silver nanoparticles was demonstrated by the typical absorption band of plasmon at 440 nm, shown in FIG. 8.

On the basis of the above description, the great versatility of this invention appears evident, namely, that a photochemical process can be used to decorate, with metal nanoparticles and selectively, hydrophobic surfaces of substrates having different shapes, sizes and chemical natures.

The conditions of the process, according to the invention, are susceptible of numerous modifications and variations, all within the inventive concept expressed in the attached claims. All the details (process conditions, nanoparticles and substrate nature) can be replaced by other technically equivalent elements, and the materials may be different according to requirements, without departing from the scope of the present invention.

The attached figures and reference numbers used in the description and in the claims are used to improve the intelligibility of the invention and provide no limitations in the scope of the claimed invention.

The invention claimed is:

1. A photochemical process for selective decoration of a hydrophobic surface with metal nanoparticles grown in situ by using metal precursors with a hydrophobic molecular domain and a photosensitizer of hydrophobic nature, the process comprising the following steps:
    activating a hydrophobic surface of a substrate by ultrasonic treatment in organic solvents;
    forming a photosensitizer/metal precursor/surface reactive adduct on the substrate through direct adsorption on the hydrophobic surface of a photosensitizer and a metal precursor, assisted by gas venting;
    irradiating thereafter the substrate with a monochromatic wavelength for a time not greater than 20 minutes; and
    removing by-products and washing the substrate surface with a solvent.

2. The photochemical process according to claim 1, wherein said decoration is formed by the metal nanoparticles grown in situ having a size and a shape dependent on a morphology of the substrate, said size ranging from 1 to 80 nm, and said metal nanoparticles being sufficiently isolated, non-aggregated, and not interconnected, so as not to create a homogeneous film.

3. The photochemical process according to claim 1, wherein said metal nanoparticles comprise a material selected from the group consisting of aluminum, iron, ruthenium, titanium, vanadium, magnesium, rhodium, indium, lanthanum, zinc, platinum, palladium, silver, gold, copper, cobalt, nickel, manganese, rhenium, iridium, osmium, cadmium, tin, rare earths, praseodymium, and silicon.

4. The photochemical process according to claim 1, wherein said substrate is selected from the group consisting of: microspheres, particles, gloves, sheets, blocks, fibers, membranes, membrane filters, containers of various shapes and sizes, plates with wells of different shapes and size, microreactors of different shapes and sizes, pipes and tubes of different shapes and dimensions, wherein said hydrophobic surface of said substrate is smooth, rough, porous with pores of different sizes and shapes, or molded.

5. The photochemical process according to claim 1, wherein said substrate is selected from the group consisting of metals, metal alloys, resins, polymers, plastics, rubber, natural materials for textile applications synthetic materials for textile use, artificial materials for textile use, latex, titanium oxide, aerogel, xerogel, ITO, silicon, silicon nitride, silicon carbide, paper, nitrocellulose, PTFE, PVDF, and cyclic olefin polymer (COP).

6. The photochemical process according to claim 1, wherein said metal precursor is a compound containing a metal ion center, said metal ion center being selected from the group consisting of aluminum, iron, ruthenium, titanium, vanadium, magnesium, rhodium, indium, lanthanum, zinc, platinum, palladium, silver, gold, copper, cobalt, nickel, manganese, rhenium, iridium, osmium, cadmium, tin, rare earths, praseodymium, silicon, having a hydrophobic organic ligand or any ligand with a part of its structure of hydrophobic nature.

7. The photochemical process according to claim 6, wherein said ligand is selected from the group consisting of beta-diketone anion, cyclopentadienyl anion, and any derivate organic compound.

8. The photochemical process according to claim 1, wherein said photosensitizer is an organic molecule containing a hydrophobic part selected from the group consisting of aldehydes, ketones, ketoacids, aromatics, polycyclic aromatic hydrocarbons, compounds containing carbonyl groups, and any hydrophobic molecule with photosensitizing properties.

9. The photochemical process according to claim 1, wherein said photosensitizer is added or is present on the hydrophobic surface as a functional group or molecule previously absorbed or covalently linked.

10. The photochemical process according to claim 1, wherein said hydrophobic surface is further decorated with nanoparticles of one or more additional metals by irradiation with one or more additional monochromatic light radiations.

11. The photochemical process according to claim 1, further comprising a step of preparing electrical contacts, said step of preparing comprising:
   providing a grooved photomask placed on the hydrophobic surface to be decorated;
   filling grooves of said photomask with a solution of metal precursor; and
   irradiating a top of the photomask with light of appropriate wavelength for forming the electrical contacts.

* * * * *